United States Patent
Kobayashi et al.

(10) Patent No.: US 6,876,577 B2
(45) Date of Patent: *Apr. 5, 2005

(54) PROGRAMMING METHOD OF NONVOLATILE SEMICONDUCTOR MEMORY DEVICE

(75) Inventors: Naoki Kobayashi, Tokyo (JP); Hideaki Kurata, Kokubunji (JP); Katsutaka Kimura, Akishima (JP); Takashi Kobayashi, Tokorozawa (JP); Shunichi Saeki, Ome (JP)

(73) Assignees: Renesas Technology Corp., Tokyo (JP); Hitachi Device Engineering Co., Ltd., Mobara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/644,747

(22) Filed: Aug. 21, 2003

(65) Prior Publication Data

US 2004/0052114 A1 Mar. 18, 2004

Related U.S. Application Data

(60) Continuation of application No. 10/260,407, filed on Oct. 1, 2002, now Pat. No. 6,636,437, which is a division of application No. 09/695,090, filed on Oct. 25, 2000, now Pat. No. 6,556,474.

(30) Foreign Application Priority Data

Oct. 25, 1999 (JP) .......................................... 11-301831

(51) Int. Cl.$^7$ ............................................... G11C 16/04
(52) U.S. Cl. ............................ 365/185.03; 365/185.24; 365/185.28
(58) Field of Search ....................... 365/185.03, 185.24, 365/185.28

(56) References Cited

U.S. PATENT DOCUMENTS

| 5,943,260 | A | 8/1999 | Hirakawa |
| 6,181,603 | B1 | 1/2001 | Jyouno et al. |
| 6,233,174 | B1 | 5/2001 | Tsujikawa et al. |
| 6,320,785 | B1 | 11/2001 | Yoshida et al. |
| 6,343,033 | B1 * | 1/2002 | Parker .................... 365/185.19 |
| 6,400,601 | B1 | 6/2002 | Sudo et al. |
| 6,456,528 | B1 * | 9/2002 | Chen ...................... 365/185.03 |
| 6,525,960 | B2 | 2/2003 | Yoshida et al. |

FOREIGN PATENT DOCUMENTS

| JP | 1027486 | 1/1998 |
| JP | 10241380 | 9/1998 |

* cited by examiner

*Primary Examiner*—Connie C. Yoha
(74) *Attorney, Agent, or Firm*—Antonelli, Terry, Stout & Kraus, LLP

(57) ABSTRACT

In a nonvolatile semiconductor memory device capable of the storage of multivalued data, fast writing can be realized with high reliability. In such a nonvolatile semiconductor memory device for storing multivalued information in one memory cell by setting a plurality of threshold voltages of data, writing of data having one threshold voltage that is the remotest to an erased state is performed prior to writing of the data having the other threshold voltages (write #1). Writing of the data having the other threshold voltages is then sequentially performed starting from the data having the nearer threshold voltage to the erased state. When writing each of the data having the other threshold voltages, writing of the data is simultaneously performed to a memory cell to which the data having the remoter threshold voltage from the erased state (write #2 and write #3).

5 Claims, 9 Drawing Sheets

FIG. 7

|  | PRESENT INVENTION | PRIOR ART 1 | PRIOR ART 2 |
|---|---|---|---|
| WRITE #1 | 1 | 13 | 1 |
| WRITE #2 | 13 | 21 | 27 |
| WRITE #3 | 21 | 1 | 13 |
| PULSES | 35 | 35 | 41 |

FIG. 8

|  | PRESENT INVENTION | PRIOR ART 1 | PRIOR ART 2 |
|---|---|---|---|
| WRITE TIME PERIOD | 1449 $\mu$ SECONDS | 1449 $\mu$ SECONDS | 1695 $\mu$ SECONDS |
| "00" LEVEL DISTURBANCE | 0.381V | 0.382V | 0.382V |
| "01" LEVEL DISTURBANCE | 0.001V | 0.097V | 0.000V |
| "10" LEVEL DISTURBANCE | 0.000V | 0.017V | 0.000V |
| "11" LEVEL DISTURBANCE | 0.000V | 0.000V | 0.000V |

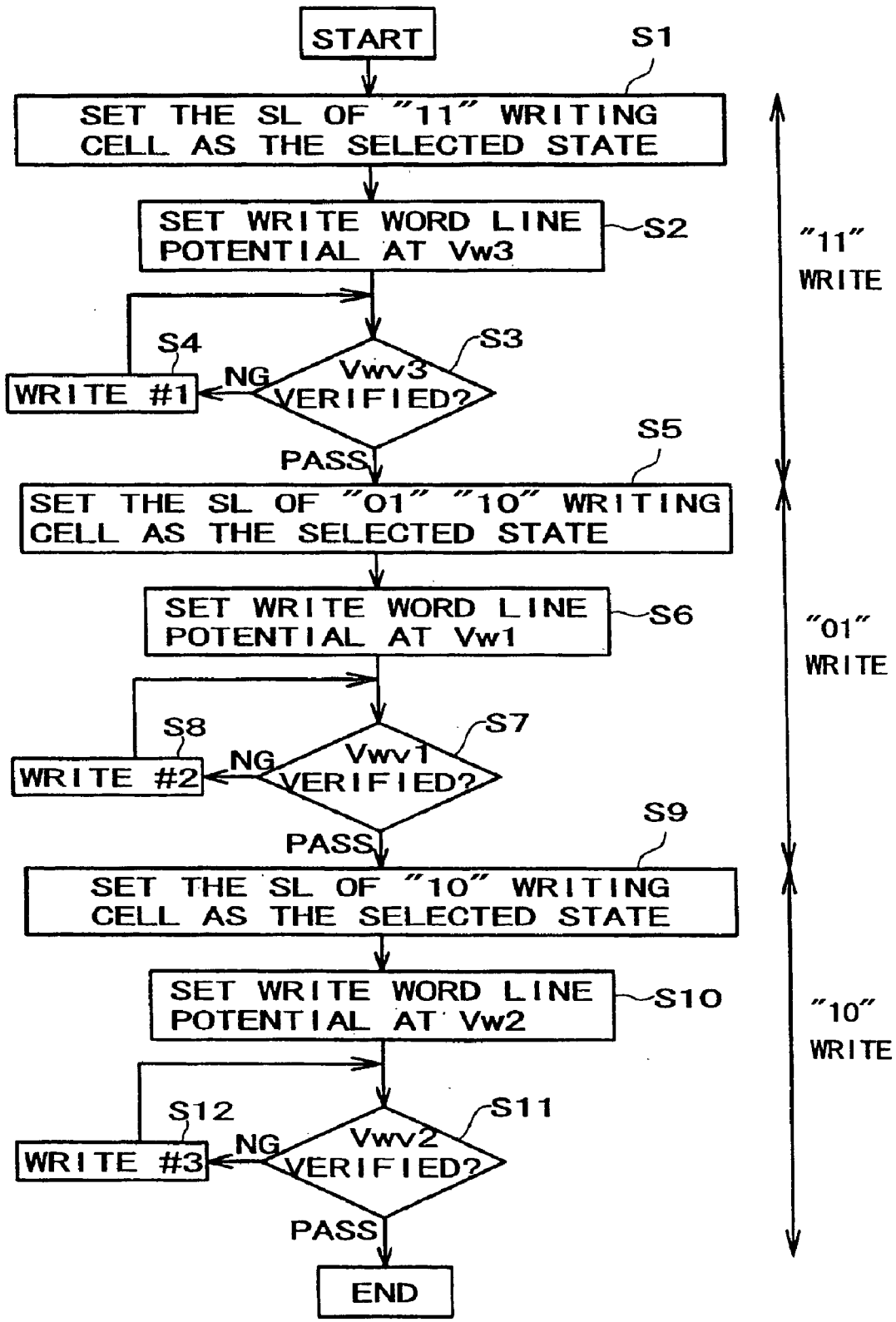

PROGRAMMING METHOD OF NONVOLATILE SEMICONDUCTOR MEMORY DEVICE

This application is a Continuation application of application Ser. No. 10/260,407, filed Oct. 1, 2002 now U.S. Pat. No. 6,636,437, which is a Divisional of application Ser. No. 09/695,090, filed Oct. 25, 2000 now U.S. Pat. No. 6,556,474, the entire disclosure of which is hereby incorporated by reference.

BACKGROUND OF THE INVENTION

1. Field of the Invention

The present invention relates to a valid technique which is applied to a memory device of multivalued information in a nonvolatile semiconductor memory device and, more particularly, to a valid technique which is applied to a nonvolatile semiconductor memory device (simply referred to as a flash memory) in which a plurality of storage information can be electrically erased all at once.

2. Description of the Prior Art

A flash memory uses nonvolatile memory elements having a control gate and a floating gate for a memory cell which can comprise one transistor. Hitherto, as for the flash memory according to a method of injecting electrons in the floating gate, there are known a flash memory using a tunnel current which is supplied to the floating gate and a flash memory using hot electrons, etc.

An operation for injecting electrons in the floating gate and setting a threshold voltage of the memory cell to the high level is called as "write" and an operation for emitting electrons from the floating gate and setting the threshold voltage of the memory cell to the low level is called as "erase".

According to the writing operation using the tunnel current, a drain area of the nonvolatile memory elements, a source area thereof, and a word line to which a control gate CG is connected are set to auxiliarily 0 V, 0 V, and 17 V, respectively, as shown in FIG. 5A. The tunnel current injects electrons in a floating gate FG and the threshold voltage is set to the high level (logic "1"). In this case, in the memory cells not to be written (nonselected cell) which are connected to the same word line, a drain area thereof and a source area thereof are set to auxiliarily 5 V and 5 V, respectively. Thereby, the writing is prevented without generating the tunnel current.

Referring to FIG. 5A, the left side of the diagonal line of 17/0 V for example denotes an applied voltage to a selected cell (in this case, the voltage of 17 V is applied to the control gate CG of the selected cell) and the right side thereof (in this case, the voltage of 0 V is applied to the control gate CG of the nonselected cell) denotes an applied voltage to the nonselected memory cell. In the other figures, applied voltages to the selected/nonselected cell are also shown.

On the other hand, according to the writing operation using the hot electrons, a drain area of the nonvolatile memory elements, a source area thereof, and a word line to which the control gate CG is connected are set to auxiliarily 5 V, 0 V, and 10 V, respectively, as shown in FIG. 5B. The hot electrons which are generated in a high electric-field area of a channel are injected in the floating gate FG and the threshold voltage is set to the high level (logic "1") In this case, in the memory cell not to be written (nonselected cell) which are connected to the same word line, a drain area thereof and a source area thereof are set to auxiliarily 0 V. Thereby, a current is prevented from flowing in the memory cell. That is, the hot electrons are prevented to be generated, thereby preventing the writing.

In the erasing operation, when the above-mentioned writing using the tunnel current and the writing using hot electrons are performed, a drain area, a source area, a word line to which the control gate CG is connected are set to auxiliarily 0 V, 0 V, and −17 V, respectively, as shown in FIG. 6. Thereby, electrons are emitted from a floating gate FG and the threshold voltage is set to the low level (logic "0").

Accordingly, one-bit data is stored in one memory cell.

Then, data of two or more bits is stored in one memory cell so as to increase a memory capacity and this proposed concept is generally called as a "multivalued" memory. Conventional arts of the multivalued memory are disclosed, and ones in Japanese Patent Laid-Open Nos. 10-241380 and 10-27486 are labeled as a first conventional art and a second conventional art, respectively, hereinlater.

Herein, a description is given to a writing sequence, a time for writing, and an influence of word line disturbance which is caused by the writing when the writing using the tunnel current is described as an example in each of the cases according to the first conventional art and the second conventional art in the flash memory in which four-valued data can be stored in one memory cell by use of four threshold-voltages. It is assumed hereinafter that data corresponding to the four of the threshold voltage which is stored in the memory cell is labeled as follows, i.e., data which is in the erased state is labeled as "00" and data which is in the writing state is sequentially labeled as "01", "10", and "11" in order of the data of the threshold voltage nearer the erased state.

According to the first conventional art, if simultaneous writing date has "01", "10", and "11" in the writing starting from the erased state, the writing is executed at three steps of write #1, write #2, and write #3 as shown in FIGS. 3B to 3D.

A description is given to the sequence of the writing operation according to the first conventional art hereinlater with reference to FIGS. 3A to 3E.

Incidentally, in the figures, a table shows write target data, memory cell data, disturbed state of the data which is written in the memory cells corresponding to four adjacent memory cells which are connected to the word line. Here, "++" shown in a column of the disturbed state denotes the word line disturbance by the writing of data having a threshold voltage higher than the threshold voltages which the memory cells have, and although not shown, "+" denotes the word line disturbance by the writing of data having a threshold voltage lower than the threshold voltages which the memory cells have (reference numerals in FIGS. 1B to 1D, FIGS. 2B to 2D, and FIGS. 4B to 4D are the same as the foregoing).

First of all, in the initial state in FIG. 3A, all of the memory cells which become the write target are set to the erased state (storing data "00") prior to the writing. A word line voltage Vw0 is 0 V.

Next, in write #1 in FIG. 3B, a word-line voltage is Vw1, and the data "01" is written to the memory cells to which the data "01", "10", and "11" is to be written. In this case, as shown in the figure, the drain voltage and the source voltage which are applied to the memory cells that become the selected cells when the writing is performed are 0 V, and the drain voltage and the source voltage which are applied to the memory cell that becomes the nonselected cell when the writing is performed are 5 V. This is the same hereinbelow.

Sequentially, in write #2 in FIG. 3C, a word line voltage is Vw2 and the data "10" is written to the memory cell to which the data "10" and "11" is to be written.

Finally, in write #3 in FIG. 3D, a word line voltage is Vw3, and the data "11" is written to the memory cell to which the data "11" is to be written.

That is, as shown in FIG. 3E, this is a writing method whereby voltages are sequentially applied to the writing data "00", "01", "10", and "11", in other words, from the low word-line voltage Vw0 to the high word-line voltage Vw3 in order of the steps of write #1 to write #3 so that the threshold voltages of the memory cells are set in distribution of the writing data "00", "01", "10", and "11" which is write target data for the threshold voltages. Incidentally, in the FIG. 3E, Vwv0 to Vwv3 are word line voltages (threshold voltages) when verification is performed.

According to the second conventional art, the writing is executed at three steps shown in FIGS. 4B to 4D.

A description is given to the sequence of the writing operation according to the second conventional art hereinafter with reference to FIGS. 4A to 4E.

Incidentally, according to the second conventional art, the drain voltage and the source voltage which are applied to the memory cell that becomes the selected cell when the writing is performed are 0 V and the drain voltage and the source voltage which are applied to the memory cell that becomes the nonselected cell when the writing is performed are 5 V.

To start with, in the initial state in FIG. 4A, all of the memory cells which become the write targets are set to the erased state (storing data "00") prior to the writing. A word line voltage Vw0 is 0 V.

Next, in write #1 in FIG. 4B, a word-line voltage is Vw3, and the data "11" is written to the memory cell to which the data "11" is to be written.

Sequentially, in write #2 in FIG. 4C, a word line voltage is Vw2 and the data "10" is written to the memory cell to which the data "10" is to be written.

Finally, in write #3 in FIG. 4D, a word line voltage is Vw1 and the data "01" is written to the memory cell to which the data "01" is to be written.

That is, as shown in FIG. 4E, this is a writing method whereby voltages are sequentially applied to the writing data "11", "10", and "01", in other words, from the high word-line voltage Vw3 to the low word-line voltage Vw1 in order of the steps of the write #1 to the write #3 so that the threshold voltages of the memory cells are set in distribution of the writing data "00", "01", "10", and "11" which is write target data for the threshold voltages. Incidentally, in the FIG. 4E, Vwv0 to Vwv3 are word-line voltages (threshold voltages) when the verification is performed.

In the writing operation of a general two-valued flash memory, it is necessary to apply the writing voltage until the memory cell whose threshold voltage increases most slowly among the memory cells which are writing-selected cells reaches a predetermined threshold voltage. However, in the multivalued memory, it is necessary to set the memory cell to which the writing already has ended to the writing-nonselected cell not so as to make the discrimination between the writing data and the data corresponding to a further higher threshold voltage impossible by the over writing.

Thus, the writing voltage is applied by use of a pulse and it is necessary to check to see if the threshold voltage of the cell increases up to a target value during the writing pulse (verification). By repeating the applying operation of the writing pulse and the verification for the writing, the threshold voltage is controlled with high precision and, thus realizing the multivalued memory.

According to the writing method of the first conventional art (disclosed in Japanese Patent Laid-Open No. 10-241380) and the second conventional art (disclosed in Japanese Patent Laid-Open No. 16-27486), simultaneous writing is performed to a plurality of memory cells on the same word line and, therein, a writing-selected memory cell and a writing-nonselected memory cell exist in accordance with the data which is written on the memory cell. In the above-mentioned simultaneous writing, it is known that there is a danger in that a high voltage is also applied to the writing-nonselected memory cell in accordance with the writing to the memory cells whose word lines are common, and weak writing occur to the writing-nonselected memory cell (the word line disturbance), thereby fluctuating the threshold voltage and also changing the storing data.

Since a time of $\mu$ tens seconds is necessary to execute the aforementioned verification for the writing once, it is important to decrease the number of times of the verification so that the writing becomes fast.

However, no problem causes because no data corresponding to the further higher threshold voltage exists in the writing of the data "11 in the case of over writing. Then, it is possible for the writing of the data "11" to reduce a necessary number of verification times by the writing by use of the high word-line voltage or a pulse having a long applying time.

According to the writing by the tunnel current, as one data whose threshold voltage is more remote from the erased state is written, the quantity of word line disturbance which affects the memory cell at the threshold voltage indicative of another data is larger, and as one data whose threshold voltage is nearer the erased state is written, the influence of the word line disturbance is larger in the writing of another data.

According to the first conventional art, all of the word line disturbance of which affects the memory cells having the data are caused when the data having the higher threshold voltage is written, so that the influence by the word line disturbance is large. Thus, when the data "11" is writing (write #3 in FIG. 3D), the influence by the word line disturbance becomes further noticeable if using the higher voltage or the pulse having the long applying time.

According to the second conventional art, the data "11" is written prior to the writing of the data "01" and "10", so that no problem of the word line disturbance causes if using the higher voltage or the pulse having the long applying time for the writing of the data "11" (write #1 in FIG. 4B). However, according to the writing method of the second conventional art, the time which the writing requires is long because the writing of the data is executed starting from the erased state.

As described above, according to the conventional arts, it is difficult to realize both the decrease in the word line disturbance and the fast operation of the writing.

SUMMARY OF THE INVENTION

It is an object of the present invention to provide a writing method of a multivalued-type nonvolatile semiconductor memory device in which the influence by the word line disturbance is small and the fast writing is realized.

The typical essentials of the preset invention to be disclosed are described in the following.

That is, there is provided a writing method of a nonvolatile semiconductor memory device for storing multivalued information in one memory cell by setting a plurality of threshold voltages comprising the steps of writing data having one threshold voltage which is the remotest from the erased state prior to the writing data having another threshold voltage, sequentially writing the data having the other threshold voltages starting from data having the threshold voltage which is nearer the erased state, and simultaneously writing data having the threshold voltage which is remote from the erased state to the memory cell.

According to the writing method, it is possible to decrease the influence by the word line disturbance which affects the memory cell which has the threshold voltage that is near the erased state and is apt to be affected by the influence of the word line disturbance. Also, according to the writing method, it is possible to reduce a time which the writing of the data having the threshold voltage that is remote from the erased state requires and to realize the fast writing.

The foregoing and other objects, advantages, manner of operation and novel features of the present invention will be understood from the following detailed description when read in connection with the accompanying drawings.

BRIEF DESCRIPTION OF THE DRAWINGS

FIG. 7 is a table showing the simulation result of the number of writing applying pulses at writing steps by writing operations according to the first embodiment of the present invention, the first conventional art, and the second conventional art;

FIG. 8 is a table showing the simulation result of writing necessary times and word line disturbance at levels of data according to the first embodiment of the present invention, the first conventional art, and the second conventional art;

FIG. 12 is a flowchart for writing/verification when the writing method shown in FIGS. 1A to 1E is used.

DESCRIPTION OF THE PREFERRED EMBODIMENTS

Next, the detailed description is given to preferred embodiments of a nonvolatile semiconductor memory device and a writing method thereof according to the present invention hereinbelow with reference to the accompanying drawings.

Incidentally, an operation for injecting electrons in a floating gate and setting a threshold voltage of a memory cell to the high level is called as "write" and an operation for emitting electrons from the floating gate and setting the threshold voltage of the memory cell to the low level is called as "erase".

<First Embodiment>

A description is given to a case in which the present invention is applied to a flash memory for writing by use of a tunnel current in which four-valued data is stored in one memory cell with reference to the drawings.

FIGS. 1A to 1E show the orders for writing data to the flash memory according to the present embodiment. A state in which a threshold voltage is erased, in other words, data in the initial state is called as "00" and writing states in which the threshold voltage is nearer the erased state are sequentially called as "01", "10", and "11". As shown in FIGS. 1A to 1D, starting from the initial state in FIG. 1A, the writing operation is sequentially executed at three steps of write #1 in FIG. 1B, write #2 in FIG. 1C, and write #3 in FIG. 1D. Herein, the corresponding relationship between threshold voltage states indicative of data and data names of "00", "01", "10", and "11" is not limited to the above-mentioned case.

Figure 1A:
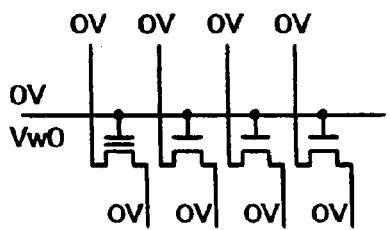
FIGS. 1A, 1B, 1C, 1D and 1E are diagrams illustrating a writing method according to a first embodiment of the present invention and showing one case in which four-valued data is stored.

According to the present embodiment, all of memory cells which become writing targets are set to the erased state (storing data "00") prior to the writing operation as shown in the initial state in FIG. 1A. In the initial state, the word line voltage is 0 V.

Figure 1B:
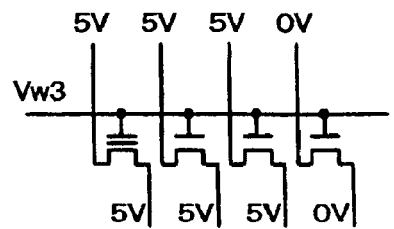

Next, in the write #1 in FIG. 1B, the word line voltage is Vw3 and the data "11" is written to the memory cell to which the data "11" is to be written, that is, to the selected cell in which both a drain voltage and a drain voltage of the memory cell are 0 V. Incidentally, it is not necessary to individually set the drain voltage and the source voltage and, for example, the connection on the source side is set to a floated state, thereby enabling the source voltage and the drain voltage to be set to have the same electric potential. The following is the same as the above-mentioned writing operation.

Figure 1C:
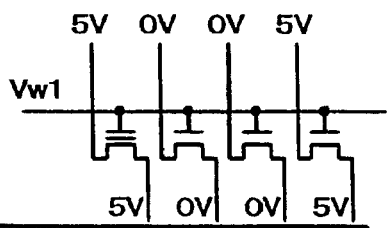

Sequentially, in the write #2 in FIG. 1C, the word line voltage is Vw1 and the data "01" is written to the memory cells to which the data "01" and "10" is to be written.

Figure 1D:
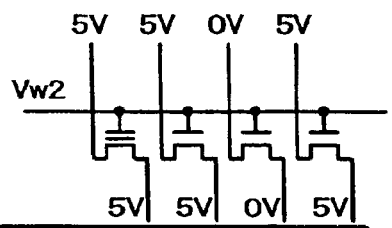
Figure 1E:
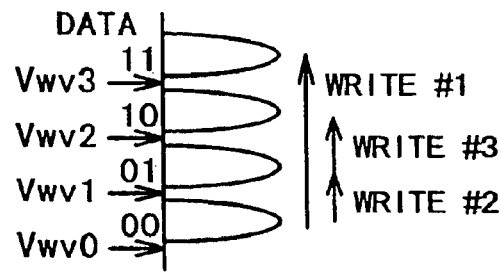

Finally, in the write #3 in FIG. 1D, the word line voltage is Vw2 and the data "10" is written to the memory cell to which the data "10" is to be written.

Herein, the drain voltage and the source voltage when the writing operation is performed are 0 V in the case of the writing-selected cell and are 5 V in the case of the writing-nonselected cell as shown in the figures.

A next description is given to a case in which the influence by the word line disturbance is reduced without the increase in writing time according to the writing method of the present embodiment.

According to the present embodiment, in the writing operation of the data "11", a high word-line voltage and a pulse having a long applying time can be used. The writing of the data "11" is possible by the same necessary pulse as that in the first conventional art according to which the writing operation is started from the data "10". Therefore, a necessary time for the writing is as short as that in the first conventional art.

In the case of the writing of the data "11", the word line disturbance influences the memory cell having the other data most largely. However, according to the present embodiment, the writing of the data "11" is performed prior to the writing of the data "01" and "10". Thereby, it is advantageous to prevent the fluctuation in the threshold voltage of the memory cell after writing by the word line disturbance.

FIG. 7 shows the simulation result in the cases of the present embodiment, the first conventional art, and the second conventional art when the word line voltages Vw1, Vw2, and Vw3 of the writing operations are 16.5 V, 17 V, and 18 V, respectively, and also shows the number of applying pulses necessary for the writing at the writing steps (write #1 to write #3). Incidentally, it is assumed that the applying time of pulses is $1\mu$ seconds in the case of writing the data "01" and "10" and is $15\mu$ seconds in the case of writing the data "11".

FIG. 8 shows times necessary for the writing when it is assumed that in each case, a time which the writing requires if a time necessary for the verification is $40\mu$ seconds at one time and sizes of the word line disturbance that affects the memory cells to which the data "00", "01", "10", and "11" is written.

Referring to FIG. 8, "00" level disturbance indicates the fluctuation of the threshold voltage that affects the memory cell to which the data "00" (indicating the erased state) is to be written when the data of the other levels ("01", "10", and "11") is written. "01" level disturbance indicates the fluctuation of the threshold voltage that affects the memory cell to which the data "01" is to be written, which is caused by the writing the data of the other levels ("00", "10", and "11") after the threshold voltage of the memory cell is set by writing of the data of the data "01". "10" level disturbance indicates the fluctuation of the threshold voltage that affects the memory cell to which the data "10" is to be written, which is caused by the writing of the other levels ("00", "01", and "11") after the threshold voltage of the memory cell is set by writing the data "10". "11" level disturbance indicates the fluctuation of the threshold voltage that affects the memory cell to which the data "11" is to be written, which is caused by the writing the data of the other levels ("00", "01", and "10") after the threshold voltage of the memory cell is set by writing the data "11".

Referring to FIG. 7, the total number of pulses necessary for the writing of the present embodiment is the same as that of the first conventional art, but is smaller than that of the second conventional art. That is, as shown in FIG. 8, the writing necessary time of the present embodiment is the same as that of the first conventional art, but is shorter than that of the second conventional art. Also, as shown in FIG. 8, the influence by the word line disturbance is equivalent to that of the second conventional art, and can decrease the change in the threshold value of the "01" level which becomes the problem in the first conventional art. However, the size in the word line disturbance indicates the maximum voltage of the threshold-voltage fluctuation after it is determined by the verification that the writing is completed.

Accordingly, the writing of the present embodiment has the same writing speed as that of the first conventional art and also the decrease in the disturbance equivalent to that of the second conventional art is realized.

Figure 11A:
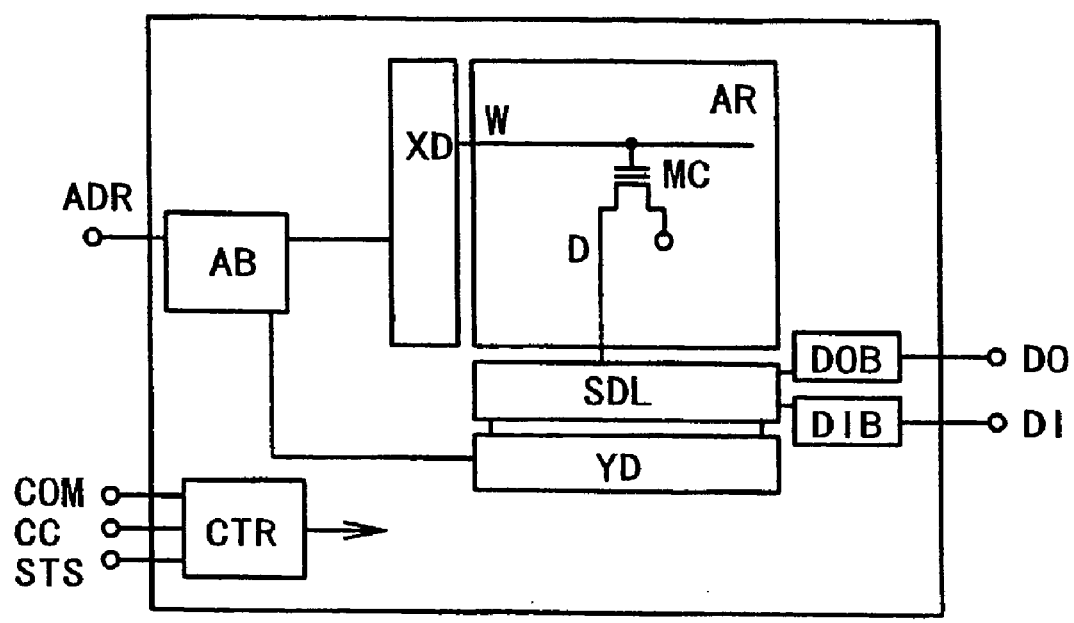
FIGS. 11A and 11B are block diagrams showing constructional examples of a nonvolatile semiconductor memory device to which the writing method of the present invention can be applied.

FIG. 11A is the circuit block diagram of a semiconductor chip indicating one constructional example of a flash memory capable of application of the writing method according to the present embodiment. First, a description is given to terminals for input/output of the semiconductor chip in FIG. 11A. Referring to FIG. 11A, reference symbol ADR denotes an address input terminal; COM a terminal for inputting a control command; STS a status output terminal for informing the outside on the state of the nonvolatile semiconductor memory device; CC control signals etc.; DI a data input terminal; and DO a data output terminal. In addition, a power supply source is provided in the semiconductor chip (not shown). If providing a multiplexer circuit is provided in the semiconductor chip, a common terminal can be used for the terminals ADR, COM, DI, DO, and STS, etc.

Figure 11B:
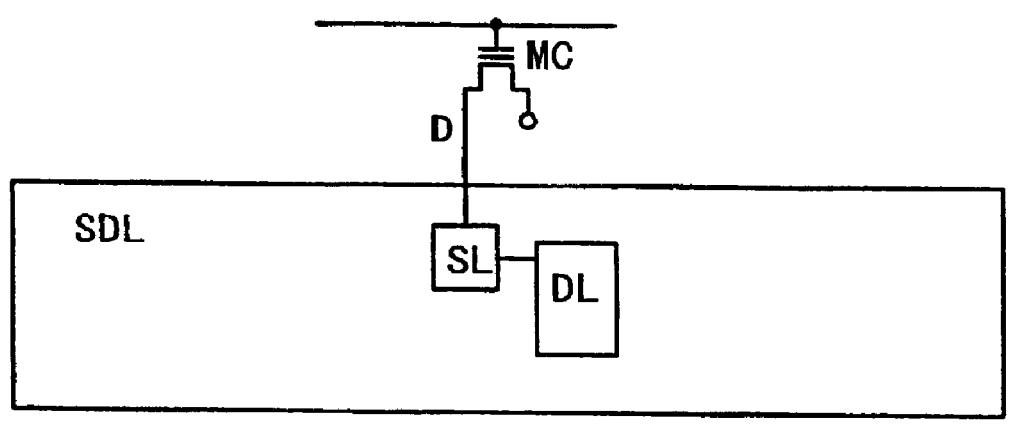

A next description is given to the internal construction of the semiconductor chip. Reference symbol CTR denotes an internal control signal generating circuit; DIB a data input buffer circuit; DOB a data output buffer circuit; AB an address buffer circuit; and AR a memory array on which memory cells MC are provided at intersections of a plurality of word lines W and a plurality of bit lines D. Then, only one of each of the word lines W, the bit lines D, and the memory cells MC is shown for the reason of the brief description. Reference symbol SDL denotes a circuit comprising a sense amplifier and a data latch circuit for storing multivalued data; XD an X address decoder circuit for decoding an address signal and selecting the corresponding word line W in the memory array AR; and YD a Y address decoder circuit for decoding the address signal and selecting the corresponding bit line D in the memory array AR. In the construction of the circuit SDL shown in FIG. 11B, a data latch circuit DL for storing the multivalued data and a sense amplifier SL for reading data in the memory cell MC are connected to the bit line D.

Herein, the sense amplifier SL also functions as a data latch circuit for holding at least two states. That is, when writing the data, the sense amplifier SL that is connected to the memory cell to which the data is to be written is set to a first state (writing-selected state) and the sense amplifier SL that is connected to the memory cell to which the data is not to be written is set to a second state (writing-nonselected state) among the memory cells in which the connected word line W are set to the writing-selected voltage. Thereby, it is possible to set whether or not the data is written.

When the verification is effected, the sense amplifier SL that is connected to the memory cell for which it is determined that the writing has been completed is set to the second state (writing-nonselected state), thereby setting the prevention of further writing.

Incidentally, if the data latch circuit DL itself has a sense amplifier function, the sense amplifier SL needs not to be independently provided and the data latch circuit DL also can function as the sense amplifier SL.

The flash memory having the present construction is controlled by transmitting an internal control signal to the constructional circuits in accordance with the control signal CC, a command to be inputted, and the state of the constructional circuits by the internal control signal generating circuit CTR.

FIG. 12 shows a flowchart of the writing/verification when the writing shown in FIGS. 1A to 1E is effected by the flash memory having the present construction and the writing process is described in brief.

The data "11" is written in steps S1 to S4. First, the sense amplifier SL of the memory cell to which the data "11" is to be written is set to enter the writing state in step S1. An electric potential of the writing word-line is set to Vw3 (a voltage is not applied to the word line yet) in step S2. The verification voltage Vwv3 is applied to the word line and it is verified whether or not data of the memory cell to which the data is to be written is "11" by the discrimination whether or not a current flows in the memory cell in step S3. If the threshold voltages of all of the memory cells to which the data "11" is to be written are not higher than the verification voltage Vwv3, the verified result becomes NG and the processing routine proceeds to step S4. In step S4, a process of the write #1 for applying the writing voltage Vw3 to the word line, in other words, applying a writing voltage of the data "11" thereto for a predetermined time is performed. Thereafter, the process for the verification in step S3 and the process for the write #1 in step S4 are repeated again until the threshold voltages of all of the memory cells to which the data "11" is to be written are higher than the verification voltage Vwv3 and the verified result becomes PASS. That is, the verification is executed each time the writing pulse is applied and if the verified result becomes PASS, the processing routine proceeds to step S5. Here, the sense amplifier SL to be connected of the memory cell to which the writing is completed in the verification is set to the writing-nonselected state. Thereby, no more writing is performed. The following verification is the same as the foregoing.

Although the verification in step S3 is directly executed after step S2 and, thereafter, the process for the write #1 in step S4 is executed, the process for the write #1 in step S4 may be executed after step S2 and, thereafter, the verification in step S3 may be executed.

Also, as for the writing process, in place of applying the writing voltage for a predetermined time, a short writing-voltage pulse may be applied predetermined times. The following verification is the same as the foregoing.

The data "01" is written in steps S5 to S8. First, the sense amplifier SL of the memory cells to which the data "01" and "10" is to be written is set to enter the writing state in step S5. An electric potential of the writing word-line is set to Vw1 in step S6. The verification voltage Vwv1 is applied to the word line and it is verified whether or not data of the memory cell to which the data is to be written is "01" similarly to the foregoing in step S7. If the threshold voltages of all of the memory cells to which the data "01" or "10" is to be written are not higher than the verification voltage Vwv1, the verified result becomes NG and the processing routine proceeds to step S8. In step S8, the process for the write #2 for applying the writing voltage Vw1 to the word line, in other words, applying the writing voltage Vw1 of the data "01" thereto for a predetermined time is performed. Thereafter, the process for the verification in step S7 and the process for the write #2 in step S8 are repeated again until the verified result becomes PASS. If the verified result becomes PASS, the processing routine proceeds to step S9.

The data "10" is written in steps S9 to S12. First, the sense amplifier SL of the memory cell to which the data "10" is to be written is set to enter the writing state in step S9. An electric potential of the writing word-line is set to Vw2 in step S10. A verification voltage Vwv2 is applied to the word line and it is verified whether or not data of the memory cell to which the data is to be written is "10" similarly to the foregoing in step S1. If the threshold voltages of all of the memory cells to which the data "10" is to be written are not higher than the verification voltage Vwv2, the verified result becomes NG and the processing routine proceeds to step S12. In step S12, the process for the write #3 for applying the writing voltage Vw2 to the word line, in other words, applying a writing voltage of the data "10" thereto for a predetermined time is performed. Thereafter, the process for the verification in step S11 and the process for the write #3 in-step S12 are repeated again until the verified result becomes PASS. If the verified result becomes PASS, the processing routine ends. Incidentally, in the above description, the relation among the word line voltages when the verification is executed is Vwv3>Vwv2>Vwv1.

<Second Embodiment>

A description is given to a case in which the present invention is applied to a flash memory for writing by use of hot electrons in which four-valued data can be stored in one memory cell with reference to the drawings.

FIGS. 2A to 2E show the order for writing data to the flash memory according to the present embodiment. A state in which a threshold voltage is erased, in other words, data in the initial state is called as "00" and writing states in which the threshold voltage is nearer to the erased state is sequentially called as "01", "10", and "11". As shown in FIGS. 2A to 2D, starting from the initial state in FIG. 2A, the writing operation is sequentially executed at three steps of write #1 in FIG. 2B, write #2 in FIG. 2C, and write #3 in FIG. 2D.

Figure 2A:
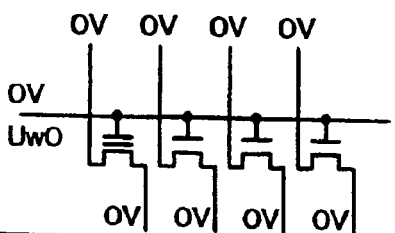
FIGS. 2A, 2B, 2C, 2D and 2E are diagrams illustrating a writing method according to a second embodiment of the present invention and showing another case in which the four-valued data is stored.

According to the present embodiment, all of memory cells which become writing targets are set to the erased state (storing data "00") prior to the writing operation in the initial state as shown in FIG. 2A. In the initial state, a word-line voltage Uw0 is 0 V.

Figure 2B:
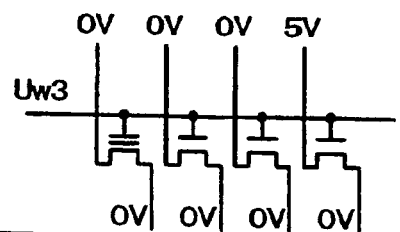

Next, in the write #1 in FIG. 2B, the word line voltage is Uw3 and the data "11" is written to the selected cell to which the data "11" is to be written, i.e., the selected cell.

Figure 2C:
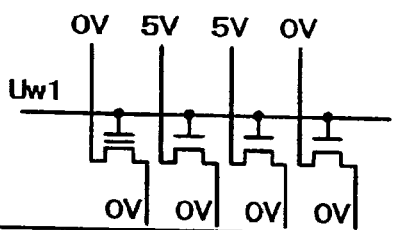

Sequentially, in the write #2 in FIG. 2C, the word line voltage is Uw1 and the data "01" is written to the memory cell to which the data "01" and "10" is to be written, i.e., the selected cell.

Figure 2D:
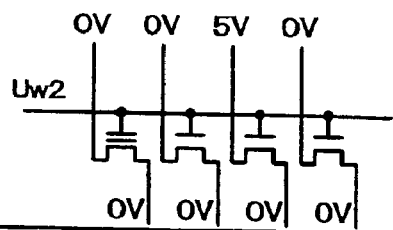
Figure 2E:
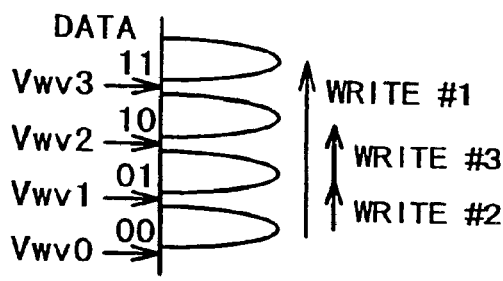
Figure 3A:
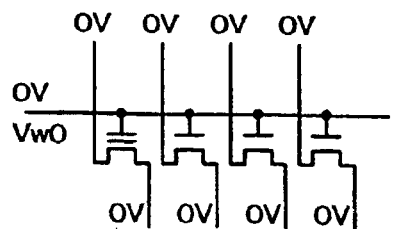
FIGS. 3A, 3B, 3C, 3D and 3E are diagrams illustrating one example of a conventional four-valued writing method.
Figure 3B:
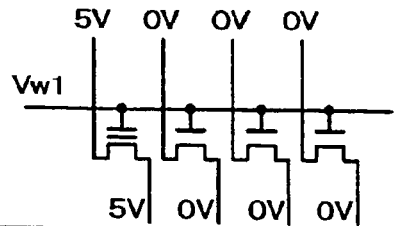
Figure 3C:
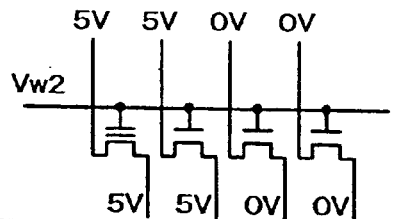
Figure 3D:
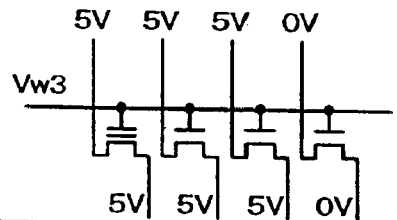
Figure 3E:
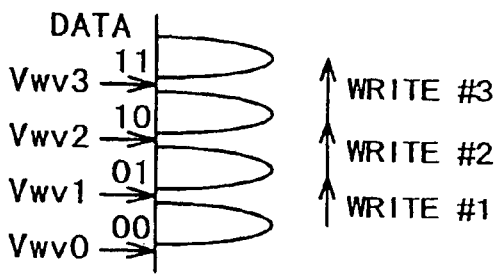
Figure 4A:
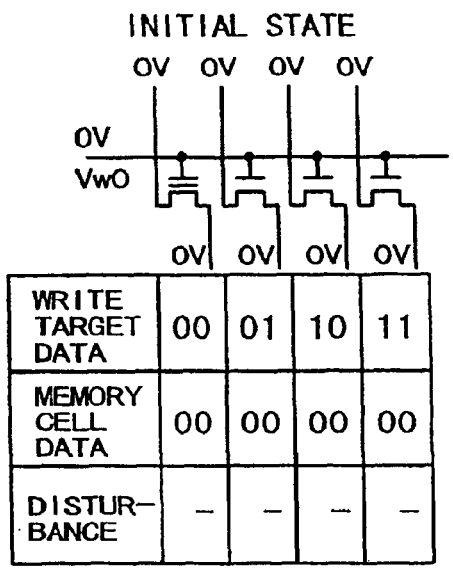
FIGS. 4A, 4B, 4C, 4D and 4E are diagrams of another example of the conventional four-valued writing method.
Figure 4B:
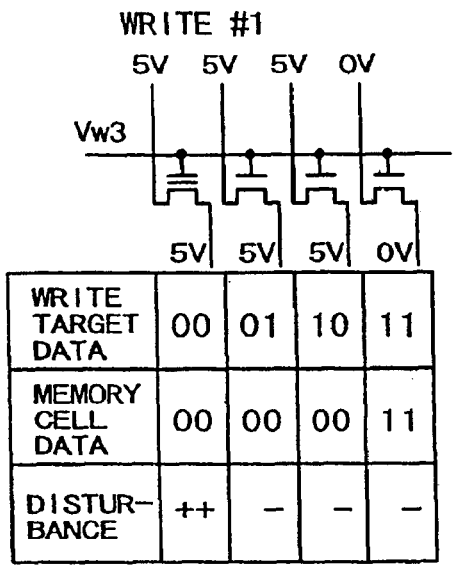
Figure 4C:
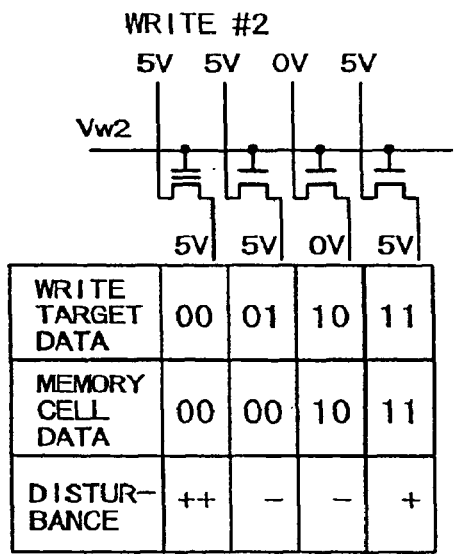
Figure 4D:
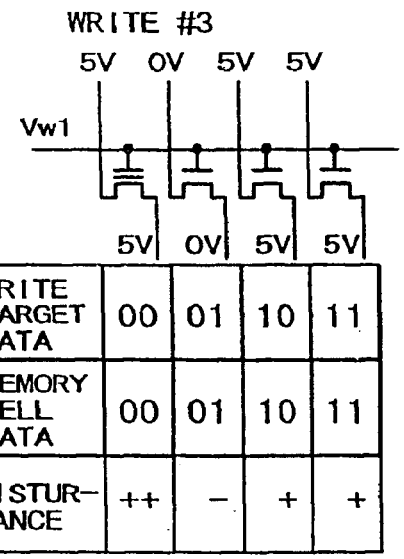
Figure 4E:
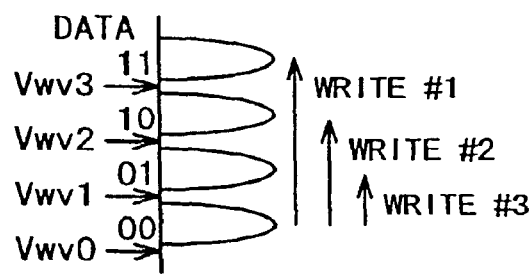
Figure 5A:
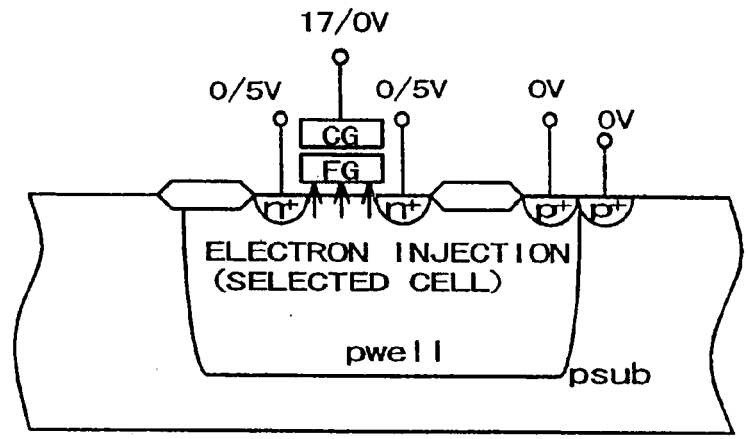
FIGS. 5A and 5B are diagrams showing writing bias conditions of nonvolatile memory elements.
Figure 5B:
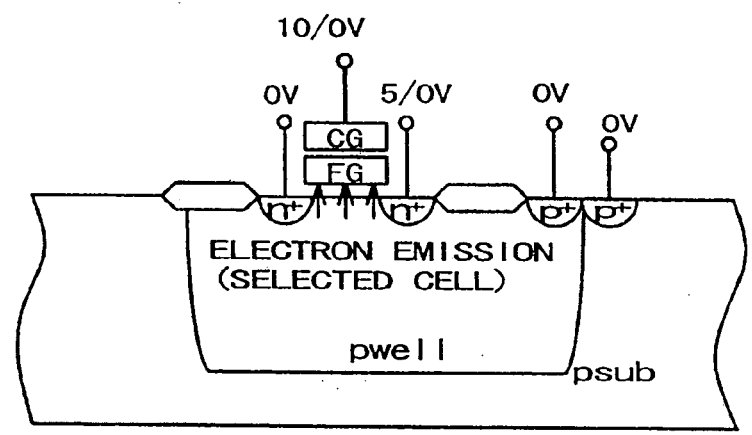
Figure 6:
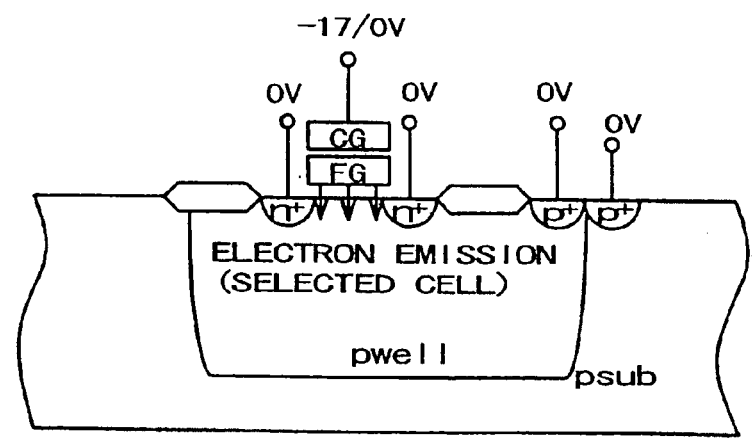
FIG. 6 is a diagram showing bias conditions when data is erased in the nonvolatile memory elements.

Finally, in the write #3 in FIG. 2D, the word line voltage is Uw2 and the data "10" is written to the memory cell to which the data "10" is to be written, i.e., the selected cell. That is, as shown in FIG. 2E, the writing voltages are sequentially applied in order of the write #1 to the write #3 so as to include the threshold voltages of the selected memory cells in the distributions of the write target data "00", "01", "10", and "11".

Herein, the source voltage is 0 V, the drain voltage of the writing-selected cell is 5 V, and the drain voltage of the writing-nonselected cell is 0 V, when the writing is performed, as shown FIGS. 2A to 2D. Incidentally, the drain voltage and the source voltage are not limited to the foregoing and, for example, the drain voltage can be changed in each of the write #1 to the write #3.

Tables in FIGS. 2B to 2D show the influences by the word line disturbance which affect the memory cells which has the data in the write #1 to the write #3. The data "11" having a higher threshold voltage is written to the memory cell prior to the writing of the data "01" and "10" in the writing according to the present embodiment. Thereby, the influences by the word line disturbance which affect the memory cells having the data "01" and "10" are reduced more, as compared with those in the case in which the first embodiment shown in FIGS. 1A to 1E is applied to the writing by use of the hot electrons.

In the write #3 in FIG. 2D, since the data "01" has already been written to the selected cell as the writing target in the write #2 in FIG. 2C when the data "10" is stored, the writing time can be reduced and the fast writing is realized.

That is, according to the method of the present embodiment, the fast writing having the small influence by the word line disturbance can also be realized in the case of the writing by use of the hot electrons.

The writing method according to the present embodiment can also be applied to the flash memory shown in FIG. 11A which is described in the first embodiment.

<Third Embodiment>

Although the above description has been given to the case in which the four-valued data can be stored in one memory cell according to the first and second embodiments, the present invention can be applied to the case in which multivalued data larger than the four-valued data can be stored in one memory cell according to the present embodiment, and this is described hereinbelow.

Figure 9:
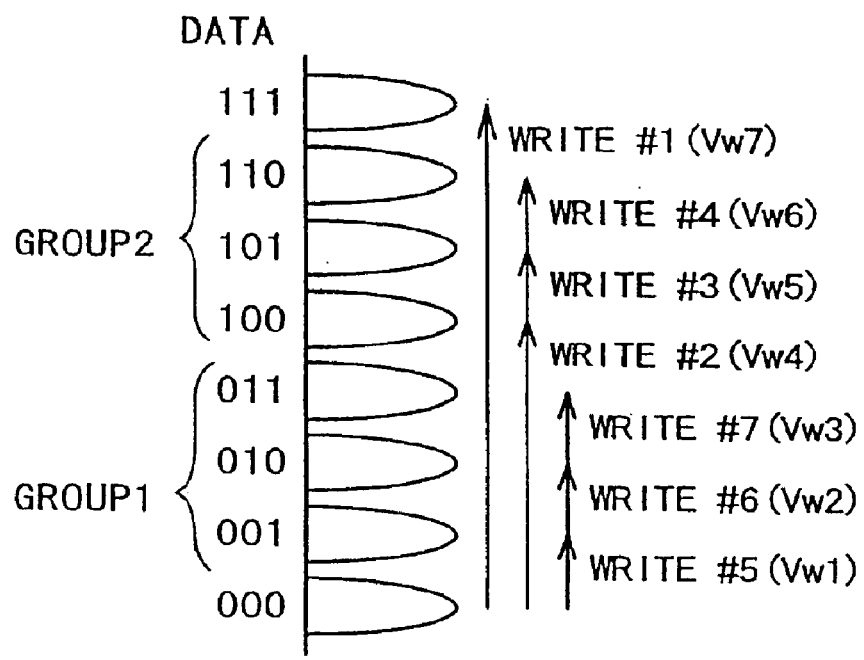
FIG. 9 is a diagram illustrating a writing method according to a third embodiment of the present invention and showing one writing order when this method is applied to a flash memory capable of the storage of eight values.

FIG. 9 shows the writing order in which the present invention is applied to a flash memory in which eight-valued data can be stored in one memory cell. Incidentally, data in the erased state is called as "000" and the writing states are sequentially called as "001", "010", "011", "100", "101", "110", and "111" and the writing is performed at seven steps of write #1 to write #7. Here, the corresponding relationship between states indicative of data and data names ("000", "001", "010", "011", "100", "101", and "110") is not limited to the above-mentioned case.

According to the present embodiment, all of memory cells which become writing targets are set to the erased state (storing data "000") prior to the writing (initial state).

Next, in write #1, the word line voltage is Vw7, and the write #1 and the verification are performed to the memory cell to which the data "111" is written, i.e., the writing-selected cell. Herein, Vw7 denotes the writing word-line voltage when the data is written to the memory cell near a seventh state from the erased state. Similarly to the above description, Vwn (n=1 to 7) denote the writing word-line voltages when the data is written to the memory cell near an n-th state from the erased state, respectively.

Sequentially, in the write #2, the writing word-line voltage is Vw4, and the write #2 and the verification of the data "100" are performed to the memory cell to which the data "100", "101", and "110" is written.

In the write #3, the writing word-line voltage is Vw5, and the write #3 and the verification of the data "101" are performed to the memory cell to which the data "101" and "110" is written.

In the write #4, the writing word-line voltage is Vw6, and the write #4 and the verification of the data "110" are performed to the memory cell to which the data "110" is written.

In the write #5, the writing word-line voltage is Vw1, and the write #5 and the verification of the data "001" are performed to the memory cell to which the data "001", "110", and "011" is written.

In the write #6, the writing word-line voltage is Vw2, and the write #6 and the verification of the data "010" are performed to the memory cell to which the data "010" and "011" is written.

Finally, in the write #7, the writing word-line voltage is Vw3, and the write #7 and the verification of the data "011" are performed to the memory cell to which the data "011" is written.

By the aforementioned writing, data having a threshold voltage which is the remotest from the initial state is written prior to the writing of the data having the other threshold voltages. In the case of the writing of the data having the other threshold voltages, the data is classified to groups starting from data having a threshold voltage which is nearer the erased state. According to the present embodiment, the data is classified to a group 1 comprising the data "001", "010", and "011" and a group 2 comprising the data "100", "101", and "110". The group 2 of the threshold voltage which is the remotest from the erased state is written. The data in the group 2 is written in order of the data of the threshold value nearer the erased state. Next, the group 1 of the threshold voltage which is the second remotest from the erased state is written. Similarly to the case of the writing of group 2, the data in the group 1 is written in order of the threshold value nearer the erased state.

In another view point, the writing method according to the present embodiment is the same as the case of classification of three groups of a group of the memory cells having the data of the threshold voltage which is the remotest from the erased state (data "111"), the group 1, and the group 2. That is, according to the writing method, the groups are sequentially written starting from the group of the threshold voltage which is the remotest from the erased state and the data in each group is written in order of the threshold value which is nearer the erased state.

By performing the writing, it is possible to reduce the influence by the word line disturbance that affects the memory cell of the threshold voltage which is apt to be affected by the word line disturbance and is near the erased state, similarly to the first and second embodiments. It is also possible to decrease the time necessary for the writing of the threshold voltage which remote from the erased state, thereby realizing the fast writing. In other words, in the same view point of the flash memory in which the four-valued data can be stored in one memory cell as shown in the aforementioned embodiments, it is also possible to write the data at a high speed with small fluctuation of the threshold voltage of the memory cell due to the word line disturbance in the case of the flash memory in which the eight-valued data can be stored in one memory cell.

Obviously, the writing method of the present embodiment can also be applied to the nonvolatile memory device in FIG. 11A.

<Fourth Embodiment>

Figure 10:
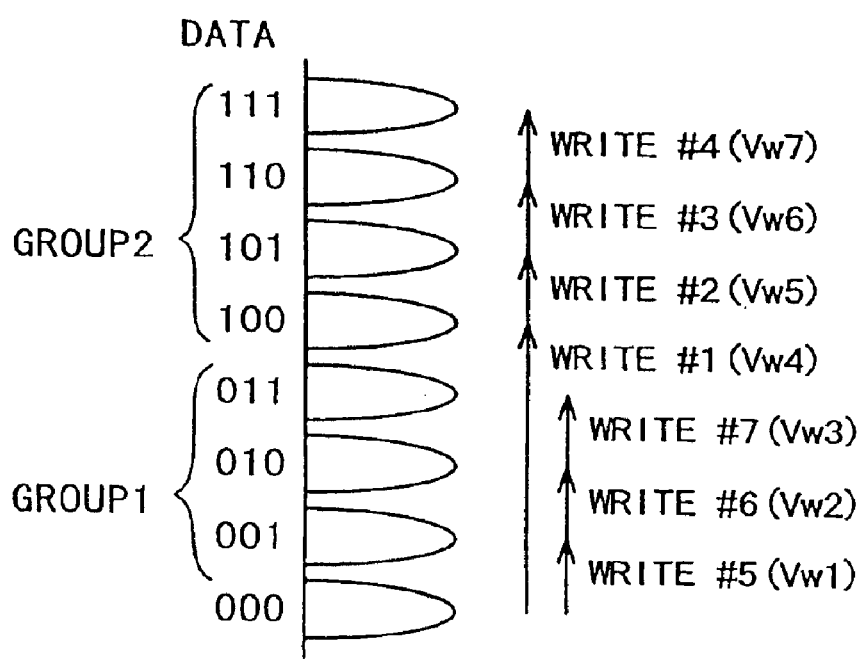
FIG. 10 is a diagram illustrating a writing method according to a fourth embodiment of the present invention and showing another writing order when this method is applied to the flash memory capable of the storage of eight values.

FIG. 10 is a diagram showing another embodiment in the case in which the writing method of the present invention is applied to a flash memory in which the eight-valued data can be stored in one memory cell and also illustrating a writing order of the data similarly to that in FIG. 9 in the third embodiment.

According to the present embodiment, prior to the writing, all of the memory cells which become written targets are set to the erased state (storing data "000") (initial state).

Next, in write #1, the writing word-line voltage is Vw4, and the write #1 and the verification of the data "100" are performed to the memory cells to which the data "100", "101", "110", and "111" is written, i.e., the writing-selected cell. Herein, Vwn (n=1 to 7) denote the writing word-line voltages when the data is written to the memory cell near an n-th state from the erased state, respectively.

Sequentially, in write #2, the writing word-line voltage is Vw5, and the writing and verification of the data "101" are performed to the memory cells to which the data "101", "110", and "111" is written.

In write #3, the writing word-line voltage is Vw6, and the writing and the verification of the data "110" are performed to the memory cells to which the data "110" and "111" is written.

In write #4, the writing word-line voltage is Vw7, and the writing and the verification of the data "111" are performed to the memory cell to which the data "111" is written.

In write #5, the writing word-line voltage is Vw1, and the writing and the verification of the data "001" are performed to the memory cells to which the data "001", "010", and "011" is written.

In write #6, the writing word-line voltage is Vw2, and the writing and the verification of the data "010" are performed to the memory cells to which the data "010", and "011" is written.

Finally, in write #7, the writing word-line voltage is Vw3, and the writing and the verification of the data "011" are performed to the memory cell to which the data "011" is written.

That is, according to the writing method of the present embodiment, the data is classified to groups starting from data having the threshold voltage which is nearer the erased state. According to the present embodiment, the data is classified to a group 1 comprising the data "001", "010", and "011" and a group 2 comprising the data "100", "101", "110", and "111". The group 2 of the threshold voltage which is the remotest from the erased state is written. The data in the group 2 is written starting from the data of the threshold value nearer the erased state is written. The group 1 of the threshold voltage which is the second remotest from the erased state is written. Similarly to the case of the writing of group 2, the data in the group 1 is written starting from the data of the threshold value nearer the erased state.

Accordingly, in the similar view point to the first to third embodiments, according to the writing method of the present embodiment, it is also possible to fast write the data without the small fluctuation of the threshold voltage of the memory cell by the word line disturbance.

Obviously, the writing method of the present embodiment can also be applied to the flash memory in FIG. 11A.

Although the preferred embodiments of the present invention are described, obviously, the present invention is not limited to the above-mentioned embodiments and it is possible to variously modify the present invention without departing from the spirit and scope of the present invention. For example, the present invention can also be applied to the case in which the memory cell having the data of the lowest threshold voltage among the threshold voltages which can be set to the memory cells is the erased state and the writing is performed by setting the threshold value to be high, alternatively, to the case in which the memory cell having the data of the highest threshold voltage among the threshold voltages which can be set to the memory cells is the erased state and the writing is performed by setting the threshold value to be low.

If the value of the data which can be stored in one memory cell is n other than four and eight and n is an integer which is larger than four, it is possible to fast write the data without the small fluctuation of the threshold voltage of the memory cell by the word line disturbance.

As will obviously be understood from the above-mentioned embodiments, to be brief, the representative advantage of the present invention is as follows.

That is, according to the present invention, in the non-volatile semiconductor memory device in which the multi-valued data can be stored, it is possible to write the data so that the increase in the time necessary for the writing is prevented and the fluctuation of the threshold voltage of the memory cell by the word line disturbance is decreased. Consequently, it is possible to realize the nonvolatile semiconductor memory device in which the multivalued data can be stored at a high speed with small fluctuation of the threshold voltages of the memory cell by the word line disturbance.

What is claimed is:

1. A writing method of a nonvolatile semiconductor memory device including a plurality of memory cells for storing data of 2 bits in each of said memory cells by setting four threshold voltages for each of the memory cells, comprising the steps of:

setting the four threshold voltages by changing them toward a predetermined direction starting from a first threshold voltage and sequentially setting the remaining three of the threshold voltages in order of the remotest threshold voltage from the first threshold voltage, the nearest threshold voltage to the first threshold voltage, and the second remotest threshold voltage from the first threshold voltage.

2. A writing apparatus for a nonvolatile semiconductor memory device including a plurality of memory cells for storing data of 2 bits in each of said memory cells by setting four threshold voltages for each of the memory cells, comprising:

means for setting the four of the threshold voltages by changing them toward a predetermined direction starting from a first threshold voltage and sequentially setting the remaining three of the threshold voltages in order of the remotest threshold voltage from the first threshold voltage, the nearest threshold voltage to the first threshold voltage, and the second remotest threshold voltage from the first threshold voltage.

3. A writing apparatus for a nonvolatile semiconductor memory device according to claim 2, wherein when setting said nearest threshold voltage to the first threshold voltage, said nearest threshold voltage to the first threshold voltage is also set to the memory cell to which the second nearest threshold voltage to the first threshold voltage is set.

4. A nonvolatile semiconductor memory device, having a plurality of memory cells, for storing data of 2 bits in one memory cell by setting a threshold voltage of the memory cell to any one of four threshold voltages, wherein each of said memory cells comprises a field effect transistor having a control gate, a floating gate, a gate insulative film, a drain area, and a source area, said field effect transistor being formed on a semiconductor substrate, wherein the threshold voltage of the memory cell is set by changing an amount of charges which exist in the floating gate, wherein the four threshold voltages are comprised of a first threshold voltage, a second threshold voltage, a third threshold voltage, and a fourth threshold voltage, wherein the first threshold voltage corresponds to an erase state, the second threshold voltage is located between the first threshold voltage and the third threshold voltage, and the third threshold voltage is located between the second threshold voltage and the fourth threshold voltage, wherein the nonvolatile semiconductor memory device executes an erase operation in which all of the memory cells, which become written targets, are set to the first threshold voltage, wherein the nonvolatile semiconductor memory device executes a first write operation in which the memory cells, to which the fourth threshold voltage is to be set, are set to the fourth threshold voltage after the erase operation, wherein the nonvolatile semiconductor memory device executes a second write operation in which the memory cells, to which the second threshold voltage or the third threshold voltage is to be set, are set to the second threshold voltage after the first write operation, and wherein the nonvolatile semiconductor memory device executes a third write operation in which the memory cells, to which the third threshold voltage is to be set, are set to the third threshold voltage after the second write operation.

5. A nonvolatile semiconductor memory device according to claim 4, wherein all of the memory cells, which become written targets, are connected to the same word line, the voltage of the word line in the first write operation is higher than the voltage of the word line in the third write operation, and the voltage of the word line in the third write operation is higher than the voltage of the word line in the second write operation.

* * * * *